US008022307B2

(12) United States Patent
Chu et al.

(10) Patent No.: US 8,022,307 B2
(45) Date of Patent: Sep. 20, 2011

(54) FABRIC CIRCUITS AND METHOD OF MANUFACTURING FABRIC CIRCUITS

(75) Inventors: Andrew W. Chu, Friendswood, TX (US); Justin A. Dobbins, Tuscon, AZ (US); Robert C. Scully, League City, TX (US); Robert C. Trevino, Seabrook, TX (US); Greg Y. Lin, Friendswood, TX (US); Patrick W. Fink, Missouri City, TX (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 1082 days.

(21) Appl. No.: 11/772,999

(22) Filed: Jul. 3, 2007

(65) Prior Publication Data

US 2010/0147562 A1   Jun. 17, 2010

(51) Int. Cl.
*H05K 1/00* (2006.01)

(52) U.S. Cl. ........ 174/254; 174/250; 174/255; 174/256; 174/260; 29/417; 29/598; 29/600; 29/825; 29/829; 29/846; 264/155; 264/257; 428/100; 700/138; 700/139; 112/457

(58) Field of Classification Search .................. 174/254, 174/209, 250, 255, 256, 260; 29/417, 432, 29/596, 598, 829, 832, 846, 600, 825; 264/155; 264/257; 428/100; 700/138, 139; 112/457
See application file for complete search history.

(56) References Cited

U.S. PATENT DOCUMENTS

| | | | | |
|---|---|---|---|---|
| 3,617,613 A * | 11/1971 | Benzinger et al. | ............ | 174/254 |
| 4,702,785 A | 10/1987 | Burger | | |
| 5,468,918 A * | 11/1995 | Kanno et al. | ................... | 174/256 |
| 5,508,936 A * | 4/1996 | King et al. | ..................... | 700/135 |
| 5,906,004 A | 5/1999 | Lebby et al. | | |
| 6,210,771 B1 * | 4/2001 | Post et al. | ...................... | 428/100 |
| 6,395,121 B1 | 5/2002 | De Bastiani | | |
| 6,447,886 B1 | 9/2002 | Mohamed et al. | | |
| 6,475,318 B2 * | 11/2002 | Weiss | ............................... | 156/93 |
| 6,599,561 B2 * | 7/2003 | Dow et al. | ....................... | 29/825 |
| 6,727,197 B1 | 4/2004 | Wilson et al. | | |
| 6,729,025 B2 | 5/2004 | Farrell et al. | | |
| 6,856,715 B1 | 2/2005 | Ebbesen et al. | | |
| 7,461,444 B2 | 12/2008 | Deaett et al. | | |
| 2003/0211797 A1 | 11/2003 | Hill et al. | | |
| 2004/0057176 A1 | 3/2004 | Dhawan et al. | | |
| 2004/0172820 A1 | 9/2004 | Lopez | | |
| 2004/0224138 A1 | 11/2004 | Farrell et al. | | |
| 2005/0146076 A1 * | 7/2005 | Alexander et al. | ............ | 264/257 |
| 2005/0235482 A1 * | 10/2005 | Deaett et al. | .................... | 29/600 |

OTHER PUBLICATIONS

I. Locher et al., "Routing methods adapted to e-textiles," in Proc. 37th Int. Symp. Microelectron. (IMAPS 2004), Nov. 2004. Chu et al., PCT/US07/73148. Notification of Transmittal of the International Search Report and the Written Opinion of the International Search Authority, or the Declaration, Dec. 18, 2007.
Chu et al., PCT/US07/73148 International Preliminary Report on Patentability, Jan. 13, 2009.

* cited by examiner

*Primary Examiner* — Xiaoliang Chen
(74) *Attorney, Agent, or Firm* — Kurt G. Hammerle

(57) ABSTRACT

A flexible, fabric-based circuit comprises a non-conductive flexible layer of fabric and a conductive flexible layer of fabric adjacent thereto. A non-conductive thread, an adhesive, and/or other means may be used for attaching the conductive layer to the non-conductive layer. In some embodiments, the layers are attached by a computer-driven embroidery machine at pre-determined portions or locations in accordance with a pre-determined attachment layout before automated cutting. In some other embodiments, an automated milling machine or a computer-driven laser using a pre-designed circuit trace as a template cuts the conductive layer so as to separate an undesired portion of the conductive layer from a desired portion of the conductive layer. Additional layers of conductive fabric may be attached in some embodiments to form a multi-layer construct.

13 Claims, 7 Drawing Sheets

FABRIC CIRCUITS AND METHOD OF MANUFACTURING FABRIC CIRCUITS

ORIGIN OF THE INVENTION

The invention described herein was made by employees of the United States Government and may be made, manufactured and used by or for the government of the United States of America for governmental purposes without the payment of any royalties thereon or therefore.

FIELD OF THE INVENTION

The present invention relates to flexible circuits and more particularly to circuits integrated into fabrics, clothing, garments, or other textiles, as well as textile circuits conformed to be integrated with vehicles and other structures.

BACKGROUND OF THE INVENTION

The term "electronic textiles", also known as "e-textiles," generally refers to fabrics that have electronics and electrical interconnections woven into them, with physical flexibility and size that cannot typically be achieved by other existing techniques for electronics manufacturing. As wireless technology becomes more integrated with commercial activities, interest in wearable antennas and flexible circuits incorporating e-textiles continues to grow. Researchers have created a variety of wearable antennas, with the most popular being wearable microstrip patches and a Planar Inverted F-type Antenna (PIFA). A wearable antenna has also been constructed by using woven conductive fabrics or by bonding copper conductors directly to a fabric substrate.

Flexible circuits or circuits integrated into clothing or textile apparel are also often referred to as "wearable computer" technology. Examples of specific applications for such embodiments include clothing-embedded electronic systems for wireless system networking, for mobile telecommunications, for digital applications at a battlefield, and for advanced electronics and antennas in spacesuits. Fabric-based flexible circuits for high-speed digital and radio frequency (RF) applications commonly require additional considerations, including Ohmic losses, impedance control, and unintentional radiation.

A list of published patents and patent applications describing related methods and articles of manufacture known in the art, which are each individually incorporated herein by reference, is given below:
U.S. Pat. Nos. 4,702,785; 5,906,004; 6,210,771; 6,395,121; 6,447,886; 6,727,197; 6,729,025; 6,856,715; U.S. Patent Application Publication No. 2003/0211797 A1; U.S. Patent Application Publication No. 2004/0057176; and U.S. Patent Application Publication No. 2004/0224138.

SUMMARY OF THE INVENTION

In one embodiment, a method for automated fabrication of complex fabric circuits and antennas utilizes a woven conductive fabric. The conductive fabric is attached to a non-conductive fabric, and then the circuit is cut using a computer-controlled cutting device. The portion of the conductive fabric that is not part of the circuit may be removed, leaving the conductive circuit attached to the non-conductive fabric. The computer-controlled cutting device enables the circuit to be produced with a complex geometry and tight layout or "trace" tolerances. The method may be repeated on the fabric circuit to form a multi-layer circuit with a cover layer and a ground plane. Electrical interconnection between layers may also be used to connect circuits in different layers of the multi-layer circuit.

In another embodiment, a method of forming a flexible circuit includes creating a first electrical circuit trace and creating a second layout having outer boundaries inset relative to the first circuit trace. The second layout is transferred to a layer attachment machine, such as an embroidery machine, and substantially planar layers of conductive fabric and non-conductive fabric are layered together. The layers are attached utilizing the second layout, and the attached planar layers are positioned on a cutting device. Using the first electrical circuit trace, the conductive layer is cut to separate a desired portion of the conductive layer from the undesired portion of the conductive layer.

In another embodiment, a flexible circuit comprises a substantially planar non-conductive flexible layer, a conductive flexible layer adjacent to the non-conductive flexible layer, and one or both of a non-conductive thread and an adhesive for attaching the conductive layer to the non-conductive layer.

In yet another embodiment, a fabric-based circuit exhibiting a complex geometric shape is made in accordance with one of the methods of the above-referenced embodiments.

In yet another embodiment, a fabric-based, equiangular spiral antenna is manufactured in accordance with one of the methods of the above-referenced embodiments.

These and further embodiments will be discussed in further detail in the following detailed description, wherein reference is made to the accompanying drawings.

DETAILED DESCRIPTION OF THE EMBODIMENTS

Before beginning a detailed description of some exemplary embodiments of the invention, the meaning of certain terms used herein is given. The term "circuit" refers to any type of electrical circuit, including a circuit that serves as an antenna, and combinations of electrical circuits and/or antennas. The term "construct" as used herein is defined as fabric circuits comprising two or more layers of fabric. The fabric circuit may comprise one conductive layer and one non-conductive layer of fabric to make a two-layer construct. The fabric circuit may also comprise multiple (i.e., more than one) layers of conductive fabric and/or multiple layers of non-conductive fabric stacked to form a multi-layer construct.

The term "attachment device" includes various methods, devices, and materials for attaching, securing, or otherwise fastening two or more layers of fabrics together. For example, in some of the embodiments, the attachment device is an embroidery machine that uses stitching or an adhesive. The term "stitching" herein includes the act of using a thread-like material to mechanically and/or electrically attach two or more layers together. "Stitching" thus includes operations or acts commonly referred to as sewing, embroidering, or suturing. The term "thread" includes any elongate conductive or non-conductive flexible member used in the step of stitching, and includes threads having a generally circular cross-section or elongated threads or ribbons having a width greater than its thickness. Threads may be applied to fabric by using sewing machines and embroidery machines. The term "adhesive" means any material suitable for adhering, gluing, or sticking objects, including layers of fabric, together, either temporarily or permanently. Adhesives may be applied by spraying, rolling, contact transfer, or by providing a dry film of adhesive that is melted. The examples of attachment devices are representatives of possible attachment members or means for attaching and are not considered to be a complete list. Other examples may include rivets, pins, and needles.

The term "cutting device" refers to tools, preferably automated, used for the act of cutting a layer of fabric. Examples of cutting devices include, but are not restricted to, Printed Circuit Board (PCB) milling machines and computer-controlled laser cutting machines. The term "conductive regions of fabric" is used herein to include waveguides, transmission lines, antennas, frequency selective surfaces, and digital lines. The term "electrical interconnect device" means a variety of methods and materials used to electrically connect conductive regions of fabric in different layers of a multi-layer construction. Examples of electrical interconnect devices include, but are not restricted to, conductive threads, rivets, metal pins, conductive buttons, and wires.

Figure 1:
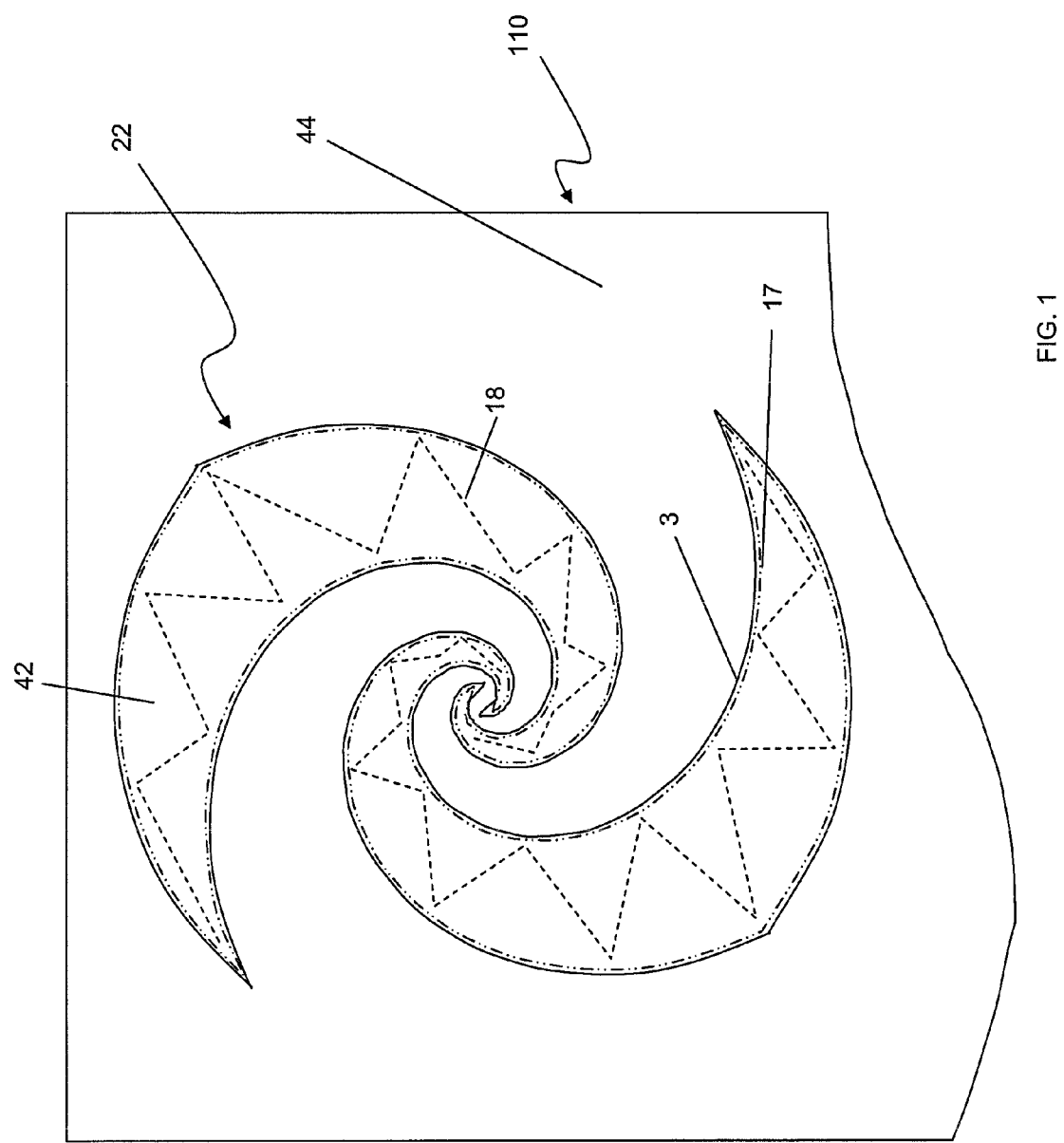
FIG. 1 illustrates a fabric-based equiangular spiral antenna having multiple arms (as shown, two) which is built using the methods of at least one of the embodiments disclosed herein. The drawing shows the fabric-based antenna before its connection with a feed structure.
Figure 2:
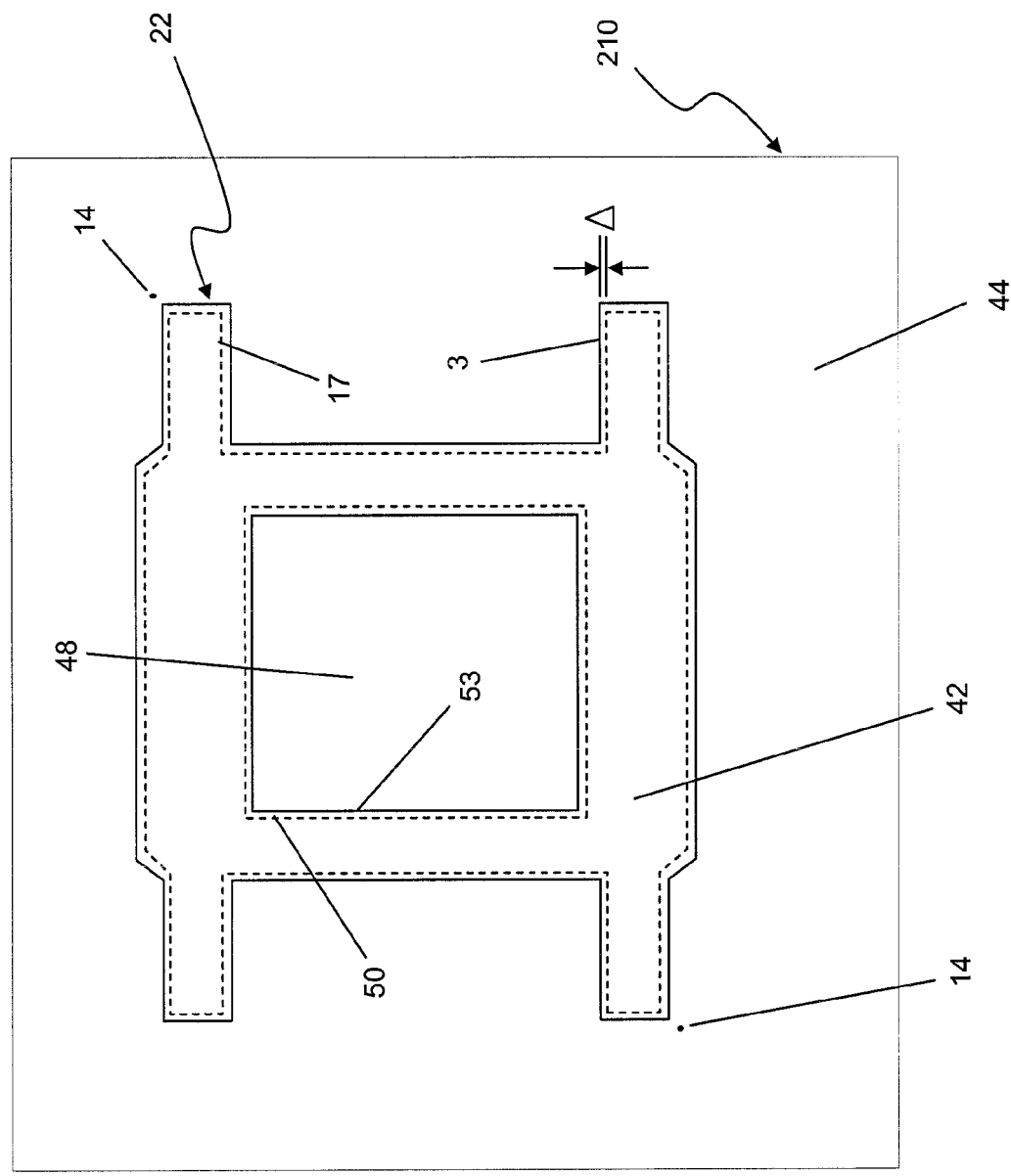
FIG. 2 illustrates a fabric-based hybrid coupler built using the methods of at least one of the embodiments disclosed herein.

Referring now to the drawings in detail, wherein like numerals indicate like elements throughout the drawings, one of the exemplary embodiments described herein includes a method for manufacturing, in a partly- or fully-automated fashion, circuits from fabrics such as, for example, a fabric-based equiangular spiral antenna 110 of FIG. 1 or a geometrically complex-shaped fabric circuit 210 serving the function of a hybrid coupler as shown in FIG. 2. In an overview of one of the embodiments, the method of manufacture comprises the step of layering a conductive fabric above and/or below a non-conductive fabric so as to form a stack of substantially planar layers of fabric, the use of an attachment device to attach the layers of fabric stacked together at certain locations to form a layered construction, and the use of a cutting device to cut the fabric in accordance with a layout as a template to form a construct that functions as a circuit. In some embodiments, the locations of attachment of the two layers of fabric are developed using computer-aided design (CAD) software to create an attachment layout with an outline. Similarly, the layout or "trace" of the desired circuit is created to form a template for cutting using computer-aided design (CAD) software. The cutting device cuts the conductive layer of fabric at a spacing from the location of attachment to separate the desired fabric circuit from the rest of the conductive layer, with the portion of the conductive layer that has not been attached to the non-conductive layer being removed because it is not part of the desired fabric circuit. If desired, additional conductive and non-conductive layers of fabric may be added to the newly-produced fabric circuit, with such additional layers being subjected to the same steps of layering, attaching, cutting, and removal after separation to form a multi-layer construct, including, if desired, a cover layer and/or a bottom layer or ground plane. During construction of a multi-layer construct, the top and bottom layers of the fabric construct may be electrically connected by an electrical interconnect device before addition of new conductive and/or non-conductive layers.

Figure 3:
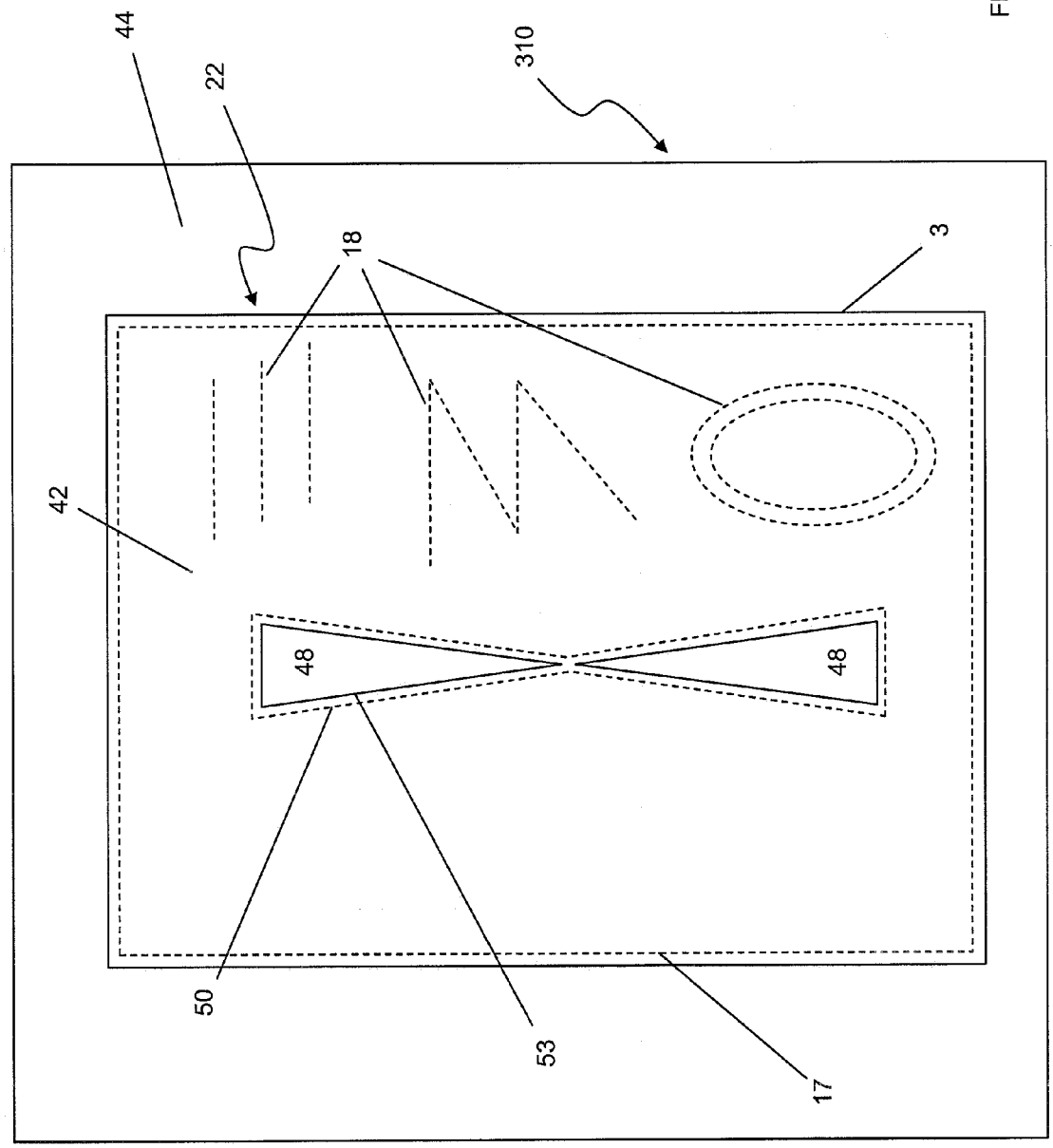
FIG. 3 illustrates a fabric-based slotted bowtie dipole along with various types of fill stitches.
Figure 6:
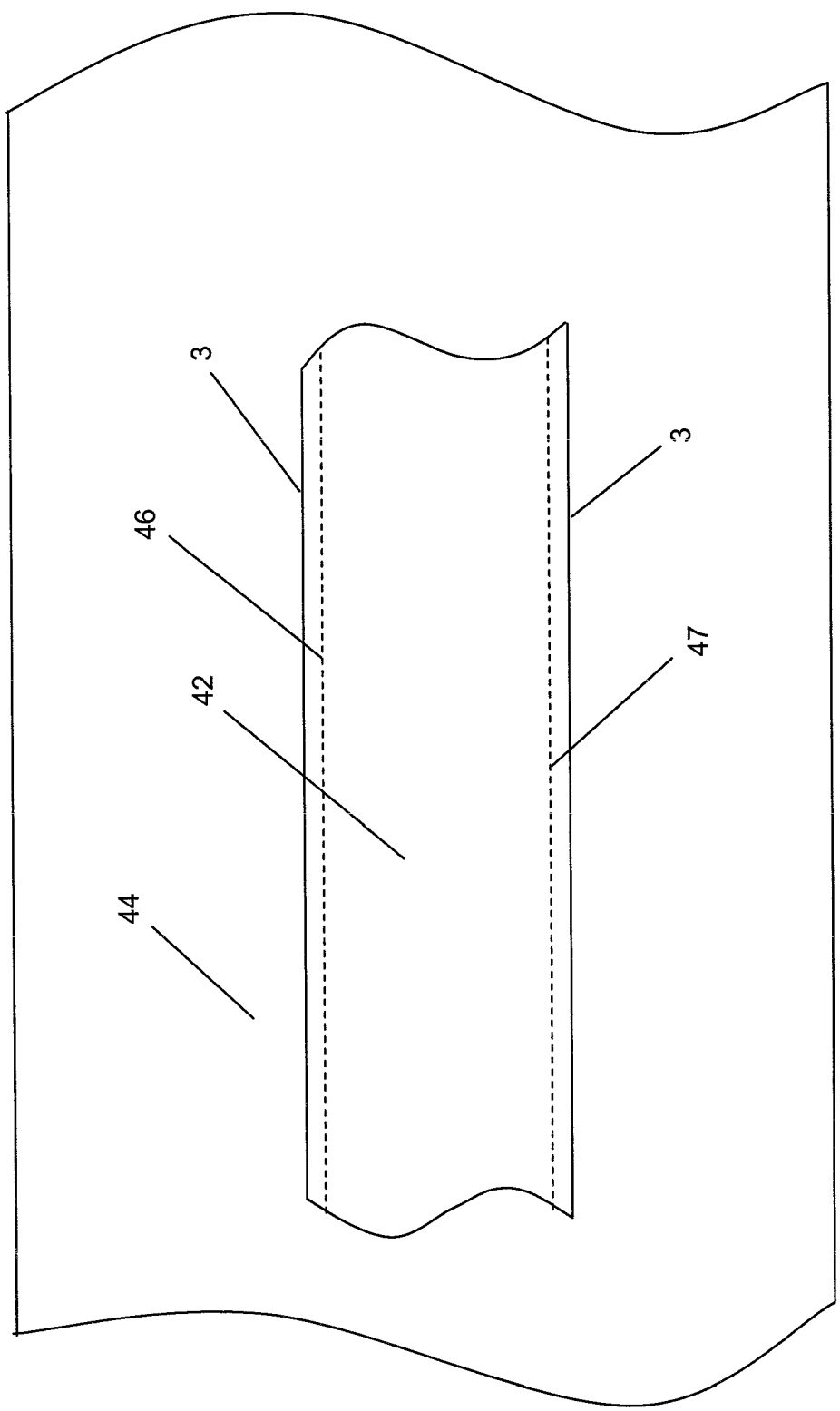
FIG. 6 illustrates two stitches along the length of a conductive layer of fabric in accordance with some of the embodiments.

Accordingly, in one embodiment, the method for manufacturing a circuit from fabric in a partly- or fully-automated fashion comprises the following steps:

a) Create a first circuit layout or trace 32 (FIG. 7) having at least one shape 22 with an exterior border 3 and, optionally, at least one interior border 53 (as shown for example in FIGS. 1-4) for the desired circuit in an electronic format such as on a computer 30 (FIG. 7) using software for a conventional template layout, e.g., CAD software. For the exemplary embodiment of FIG. 2, the first circuit trace is used to cut along interior border 53 and exterior border 3, separating the desired circuit from the conductive sheet (i.e., conductive fabric on the inside and outside of shape 22 is removed).

b) Optionally, create fiducials 14 (FIG. 2) on the same electronically-generated layout as the first circuit trace. Fiducials may not be required for some layouts, as for example the layout of FIG. 1, where the corners or shape of the circuit trace may function as fiducials. Fiducials enable alignment of the fabric with the automated cutting device.

c) Convert (by saving, exporting, electronically storing, etc.) the circuit trace 32 into a set of instructions having a format (e.g. Gerber) recognized and used (i.e., readable) by an automated cutting device 36 (FIG. 7) for cutting material into a size and shape in accordance with an electronically-created cutting layout.

d) Using the circuit trace 32, create a second layout for attachment having at least one outline of similar shape but differing size (either reduced or larger) as compared to the shape 22 of the circuit trace 32. For an embroidery machine, this step entails developing a digitized set of machine instructions for the stitch runs. The outline of the second layout, which for FIG. 2 corresponds to exterior border stitching 17 and interior border stitching 50, is smaller and larger in size than exterior border 3 and interior border 53, respectively, depending on what portion of conductive fabric is later discarded, by an amount of spacing, as is represented in one embodiment by the symbol Δ ("delta") in FIG. 2. Additional fill stitches 18 (FIGS. 1 and 3) within the border stitching 17 may also be used to aid in attaching or holding a fabric layer to its adjacent supporting fabric layer. As part of this step of creating a second layout, some embodiments further comprise the act of creating secondary fiducials that are aligned with the fiducials 14 of the circuit trace 32 as mentioned above in step (b).

e) Place a conductive fabric layer 42 adjacent to (such as on top or underneath) a non-conductive or insulating fabric layer 44 (see FIG. 5), and optionally a third bottom layer and/or additional layers of conductive fabric. The layers of conductive and non-conductive fabric are stacked upon one another to form a layered construction like layers of a sandwich so as to be substantially flat (i.e., planar) and relatively free of wrinkles, creases, etc.

f) Place the layered construction in a hoop or other device capable of temporarily holding the two or more layers of stacked fabric in position.

g) Using the set of instructions for the stitch runs of the embroidery machine developed in step (d) above, embroider the stitches corresponding to the border outlines 17 and 50 of the second layout, the fiducials 14, and the fill stitches 18 (if needed) on the layered construction of the fabric using non-conductive thread for the stitches. The step of stitching attaches the conductive fabric layer 42 to the non-conductive fabric layer 44. For this step of stitching, the layers of fabric may be held together or secured with two border stitch runs 46 and 47 along each side of border 3 as shown in FIG. 6, and/or the layers of fabric may be held together or secured with an arbitrary pattern of fill stitches 18 within the interior of the border 3 as shown in FIGS. 1 and 3.

h) Transmit, send, or otherwise transfer the first circuit trace 32 created in step (a), along with its corresponding set of instructions of step (c), to the storage medium or processing unit of the automated cutting device 36.

i) Use the fiducials 14, or a corner or the shape of the trace 32, to align the borders 17 and/or 50 stitched on the fabric with the coordinates of the first circuit trace 32 now loaded in the automated cutting device.

j) Activate the automated cutting device to cut excess material in accordance with the set of instructions corresponding to the shape given by the first circuit trace 32. For the exemplary embodiment of FIG. 2, the automated cutting device 36 is used to cut the conductive fabric along both the exterior and interior region of the borders 3 and 53.

k) Remove the undesired, unattached (i.e, separated) conductive fabric layer that is exterior and/or interior of shape 22, leaving the first circuit formed of conductive fabric (FIG. 1) with embroidered fill stitches 18 (if used) and border stitches 17 corresponding with the second layout of attachment. For the exemplary embodiment of FIG. 2, the excess of the conductive layer is both inside and outside of shape 22, so separated fabric is removed on both sides of the shape 22 to reveal the underlying non-conductive layer 44 with void 48.

As mentioned above, in some embodiments the method for manufacturing a circuit from fabric in a partly- or fully-automated fashion comprises the use of a PCB milling machine as the cutting device, whereas in some other embodiments the step of cutting uses a laser or laser cut-out machine to cut the fabric circuit in accordance with the shape 22 of circuit trace 32. In some embodiments, the shape 22 of circuit trace 32 may comprise a combination of two or more shapes, such as the shape of the equiangular spiral shown with two arms (i.e., each arm comprises a shape) of FIG. 1. In such embodiments, the layer of conductive fabric 42 is cut in accordance with this multi-shaped trace 32 to manufacture a fabric circuit having multiple conductive fabric shapes positioned on one non-conductive layer 44.

Figure 7:
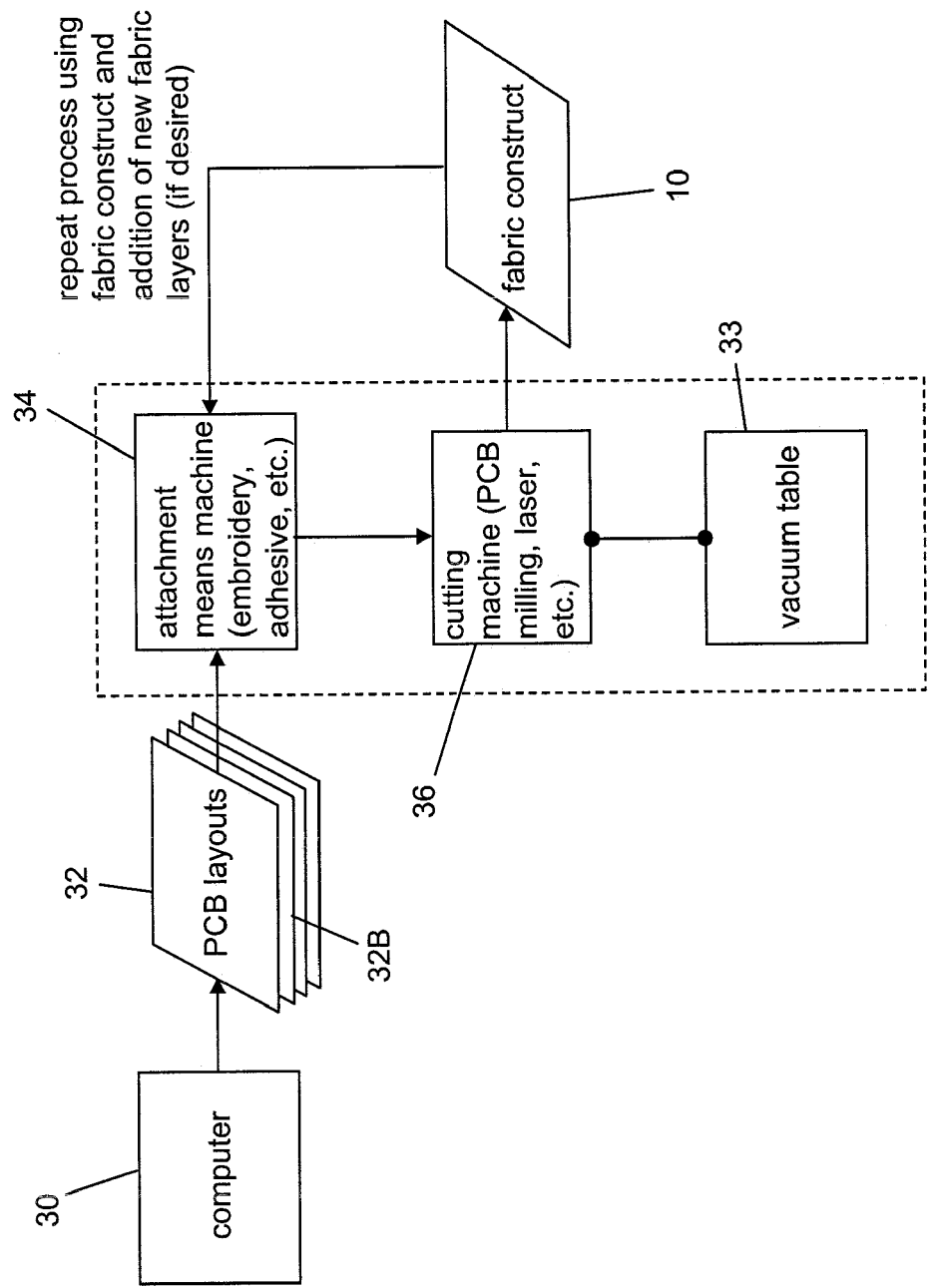
FIG. 7 illustrates a system suitable for implementing the methods of forming the fabric circuit in accordance with some of the embodiments disclosed herein.

In another embodiment, a vacuum table 33 (as indicated in FIG. 7) may be used to hold the layers of fabric in position during the cutting operation in addition to or as substitution for the use of a hoop.

The amount of spacing, represented by the symbol $\Delta$ ("delta"), between the non-conductive border stitches 17 (corresponding to the outline of the second layout or attachment layout) and the border 3 of the cut conductive layer will depend on the material and construction of the conductive layer. The threads along the cut edge of conductive fabric should not be cut at a location such that the cut threads are allowed to retract back through or away from the border stitching. On the other hand, an excess amount of conductive fabric cut from the outline of border stitching 17 may adversely affect the performance of the electrical circuit. In some embodiments, delta will have an approximate value ranging from about 0.010 inches to 0.050 inches.

In an alternate embodiment, the method for manufacturing a fabric construct comprises the use of an adhesive as a substitution for, or in addition to, the act of embroidering. The specific steps of this alternate method using an adhesive are now described below:

1) Create a first circuit trace 32 (FIG. 7) having at least one shape 22 with an exterior border 3 and, optionally, at least one interior border 53 (FIGS. 1-4) for the conductive region of fabric in an electronic format such as on a computer using CAD software. Optionally, circuit trace 32 may comprise voids 48 in the conductive layer of fabric, as shown in FIGS. 2 and 3. The voids 48 typically require interior border stitching 50, also shown in FIGS. 2 and 3. For the exemplary embodiment of FIG. 3, the voids are referred to as "complementary elements".

2) Optionally, create fiducials on the same layer used for first circuit trace 32. Fiducials may also optionally be created on a separate virtual layer. Fiducials may not be required for some layouts, as for example the layout of FIG. 1, where the corners of the circuit trace may function as fiducials for alignment with the automated cutting device.

3) Convert (by saving, exporting, electronically storing, etc.) the circuit trace 32 into a set of instructions having a format (e.g., Gerber) recognized and used (i.e., readable) by the automated cutting device 36 for cutting material in a size and shape in accordance with an electronically-created circuit trace 32.

4) Attach the layer of conductive fabric adjacent to (either above or below) the layer of non-conductive fabric using adhesive, keeping all layers substantially flat (i.e., planar) and relatively free of wrinkles so as to form a layered construction of fabric.

a) In some embodiments, the adhesive may be heat-activated to bond the conductive fabric to the non-conductive layer before cutting the conductive fabric circuit. For instance, an automated hot-tip machine or a laser may be used to heat-activate a localized area of adhesive, which is positioned in regions correspondingly near the border 3 of the circuit trace 32 and in metallic regions that form the circuit and/or antenna. The steps for this act of attaching comprises the following:

i) Transmit the electronically-created circuit trace 32 of step (1) above to the automated hot-tip machine or laser.

ii) Instruct the automated hot-tip machine or laser to heat-activate the adhesive in the localized regions of attachment where the adhesive is located. The act of heat-activating should occur in locations that correspond with the shape (or shapes) 22 of the circuit trace 32 and the desired portions of conductive fabric.

iii) Optionally, generate fiducials by heating the fabric so as to make a visible mark. Alternatively, fiducials may be marked on the conductive fabric before heat-activating the adhesive. In this alternative approach, the coordinate system of the hot-tip machine or laser should be aligned with the pre-marked fiducials.

In some embodiments, a "hot-tip" machine may comprise the automated cutting device with an additional tool so that fabric repositioning and fiducials are not required. For instance, the "hot-tip" may be a small footprint iron such as a rod having a (flat) tip of various diameters. Electric current running through the rod would generate heat, making the tip hot enough to melt the adhesive to the fabric.

b) In some other embodiments, a weaker adhesive may be used to adhere the conductive and non-conductive layers. The parts of the conductive layer to be removed are easily separated, following a cutting step, due to the weak bond. A secondary step of attaching, such as the acts of embroidering or sewing, or the use of a cover layer or rivets, can be used to further attach the layers to form the circuit.

5) Position the layered fabric on the table of the cutting device. The cutting device may further comprise a vacuum table 33 to assist in holding the layered fabric in position.
6) Transmit, send, or otherwise transfer the set of instructions corresponding to the electronically-created first circuit trace 32 of step (3) above to the storage medium or processing unit of the automated cutting device 36.
7) Activate the cutting device to cut the borders 3 and 53 and, optionally, the fiducials 14 in the conductive fabric layer in accordance with the corresponding shape of the first circuit trace 32.
8) Separate and remove the undesired, unattached layer of cut conductive fabric that is external or internal to the borders 3 and 53, leaving the conductive layer that forms the fabric circuit.

Two or more attachment devices may be used in combination to construct a fabric circuit. For example, in some embodiments an adhesive may be used as an initial attachment device, followed by stitching or embroidery as a secondary attachment device after the excess part of the conductive layer is removed from the desired circuit. Optionally, in some other embodiments the adhesive may be washed away after applying a secondary attachment device.

Another optional approach to performing the step of attaching comprises the placement of a non-conductive cover layer on top of a previously cut conductive layer in which the undesired conductive portion has already been removed. A set of instructions to sew a holding stitch, which may comprise a cross-stitch pattern, may be created to sew or embroider the non-conductive cover layer to the conductive layer and optionally other layers below. Additionally, the cover layer of non-conductive fabric may be used to hold down the edges of a circuit, such as for example the edge region of spacing defined by the symbol Δ ("delta") in FIG. 2. The cover layer may also function to provide electrical insulation for the outer conductive layer.

Figure 5:
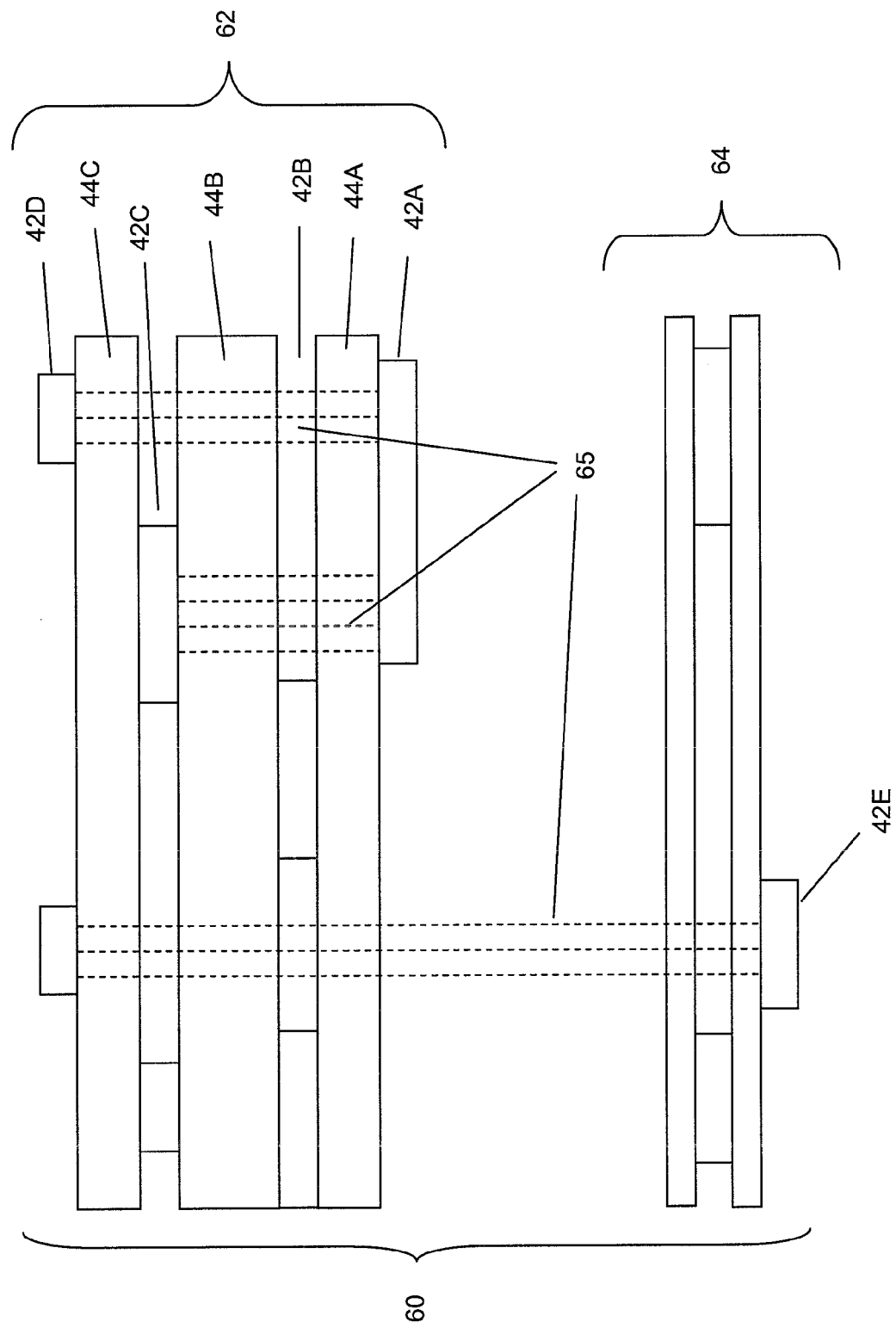
FIG. 5 illustrates a cross-section of multiple layers of a fabric circuit to illustrate a connection in accordance with some of the embodiments.

Multi-layer constructs may be manufactured by adding more layers of conductive or non-conductive fabric to an existing fabric construct manufactured by one of the preceding embodiments. In this alternate embodiment, the method of manufacturing a multi-layer construct having at least one additional layer of conductive fabric comprises the following steps:
1) Create a second circuit layout or trace 32B for the new layer of conductive fabric in an electronic format such as on a computer, using for example CAD software.
2) Optionally, create fiducials 14 on the second circuit trace.
3) Convert (by saving, exporting, electronically storing, etc.) the second circuit trace 32B into a set of instructions having a format (e.g. Gerber) recognized and used by an automated cutting device 36 (FIG. 7) for cutting material into a size and shape in accordance with an electronically-created cutting layout.
4) Layer or stack and then join additional conductive layers and (if desired) non-conductive layers of fabric adjacent to the previously-manufactured constructs using an attachment device.
   a) For embodiments wherein an embroidery machine is being used, place the new layers of fabric along with the previously-manufactured construct in a hoop and embroider or stitch together the new layers. A pre-programmed set of instructions for the embroidery machine for sewing a pattern of holding stitches and for sewing a pattern of attaching stitches may comprise border stitches 17 and 50 and/or fill stitches 18 of non-conductive thread as a means for attaching the new layers to the previously-manufactured construct. In some embodiments, the layers of fabric could be attached with a single stitch run down the middle of the second circuit layout or trace. In other embodiments, the layers of fabric could also be held or attached with two stitch runs, with each run being near the edge of the border 3 planned for the conductive layer of fabric along the length of the second layout or trace, as shown by the stitch runs 46 and 47 of FIG. 6. In other embodiments, the second circuit trace could be attached with an arbitrary pattern of fill stitches within the interior region of conductive fabric corresponding with the second circuit trace. Regions of the construct that are circuit-free, (i.e., layers of fabric comprising only ground layers or dielectric layers) may be filled with a variety of different types of stitch runs. Similarly, holding stitches may either be any arbitrary pattern to fasten the entire layered construct, or may be a specifically-designed pattern targeted within a selected shape, such as the circuit trace itself or a second layout of similar shape but slightly different size, for one or multiple layers.
   b) For embodiments using an adhesive as an attachment device, apply an adhesive to the new layers of fabric and join them to the previously-manufactured construct.
   c) Optionally in some embodiments, needles or thin rods may be inserted through the multiple layers of fabric to align the conductive regions of the multiple layers and to set fiducial marks for the computerized embroidery machine, the hot-tip machine or laser when using an adhesive, or the cutting device. In one embodiment, alignment of the embroidery machine may be accomplished by manual alignment of the needle with the fiducials. In another embodiment, alignment of the embroidery machine may be accomplished by manual alignment of the layers of fabric positioned in the hoop or on the vacuum tabletop. In yet another embodiment, alignment of the attachment device or the cutting device may be accomplished using video cameras integrated with either or both of such devices.
5) Position the layered fabric on the cutting device. The cutting device may further comprise a vacuum table to assist in holding the layered fabric in position.
6) Transmit, send, or otherwise transfer the set of instructions corresponding to the electronically-created second circuit trace 32B above to the storage medium or processing unit of the cutting device 36.
7) Activate the cutting device to cut the borders 3 and 53 and, optionally, the fiducials 14 in the new conductive fabric layer in accordance with the corresponding shaped border of the second circuit trace.
8) Separate and remove the undesired cut layer of conductive fabric that is external and internal to the borders 3 and 53, respectively, leaving the conductive material that forms the fabric circuit (e.g., 210, 310, 410).
9) Optionally, create and use a set of stitching instructions that program a computer-controlled embroidery machine to electrically connect the conductive regions of fabric among a multiple-layer construct using an electrical interconnect device 65 as shown in FIG. 5. For the electrical interconnect device 65, conductive thread, a conductive rivet, or a conductive ribbon may be used.

The steps for the method of manufacturing a multi-layer construct may be repeated to manufacture additional layers of conductive and non-conductive layers using additional circuit traces if desired. For example, at least one additional layer of conductive fabric (42A or 42D) may be placed on the top and/or the bottom of a multi-layered construct to create a first layered construct 62 as shown in FIG. 5. The previously-described steps for manufacturing a multi-layered construct may be repeated as needed to shape the next circuit layout or trace, attach the layer(s) of fabric, cut the layers of fabric, and provide interconnectivity between the multiple layers of fabric as desired to fabricate a multi-layer construct. In some embodiments, an electrically insulating layer of fabric 44 may be placed on top of a conductive layer, while in other embodiments an electrically insulating layer 44 may be placed on the bottom of the construct to insulate a ground plane or bottom circuit. In FIG. 5, electrical connectivity in layered construct 62 is first established between layers 42A and 42C before adding and electrically connecting, by electrical interconnect device 65, layer 42D to layer 42A.

The steps for the method of manufacturing a multi-layer construct may also be reiterated to manufacture multi-layered groups that are fastened and connected to create a final group stack or construct 60 as shown in FIG. 5. The layered construct 64 is attached to layered construct 62 to form construct 60. Electrical connectivity between the top of layered construct 62 and the bottom of layered construct 64 is provided by electrical interconnect device 65.

Yet another alternate embodiment entails creating a layered construct using a permanent or temporary adhesive and then machining the circuit on the conductive (top) layer with an optional step of post-cut embroidery to permanently fasten the layers. This latter embodiment enables the manufacture of high density circuits.

Figure 4:
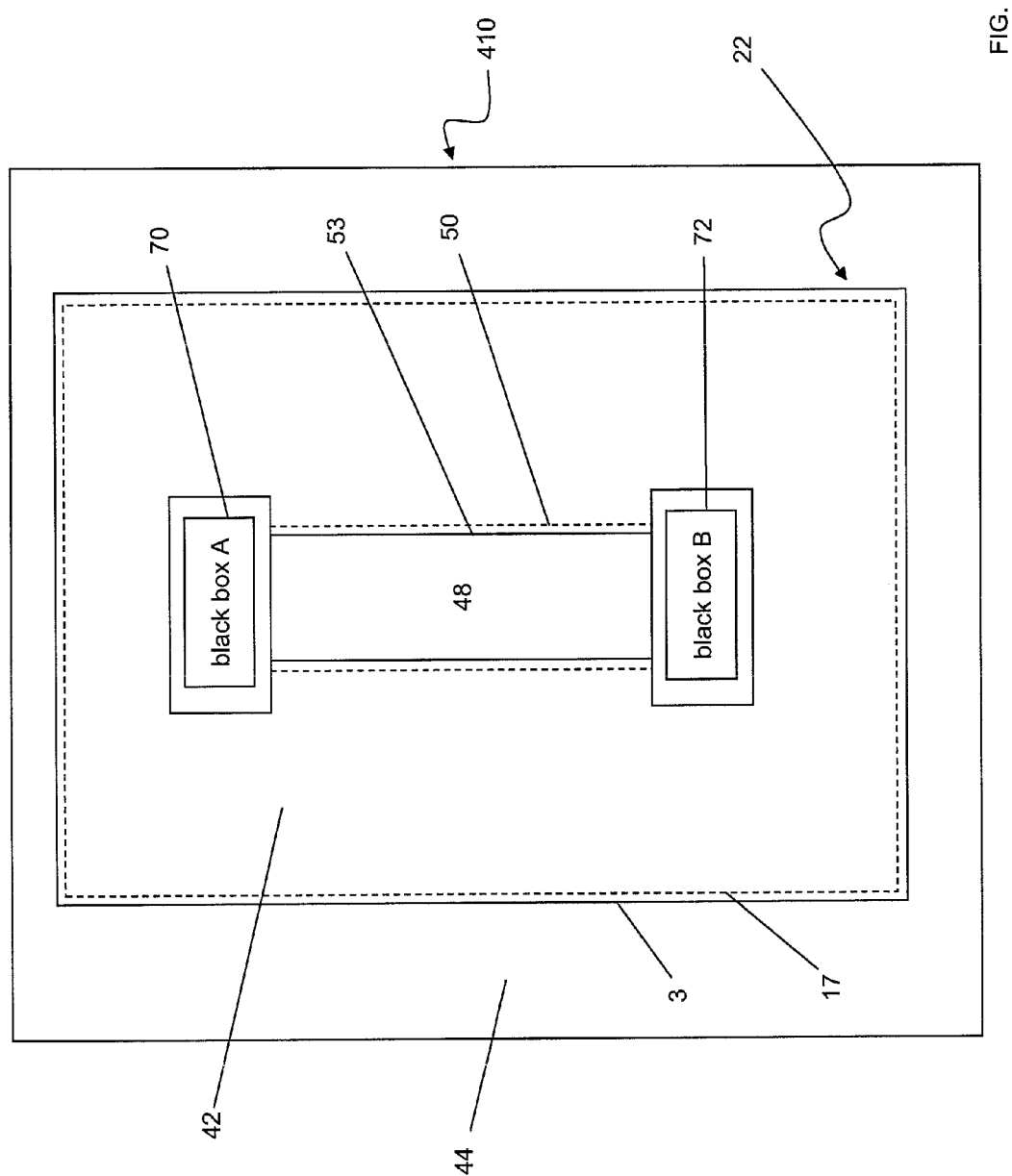
FIG. 4 illustrates a fabric-based complimentary antenna (slot antenna) with embroidered outline, as well as possible black box attachments.

FIGS. 1 and 2 illustrate embodiments of fabric circuits manufactured in accordance with the methods previously described above. In particular, FIG. 1 comprises a fabric-based equiangular spiral antenna 110 having two arms, and FIG. 2 illustrates a fabric-based hybrid coupler circuit 210. Similarly, FIGS. 3 and 4 illustrate additional embodiments of fabric circuits 310 and 410, respectively, made by the methods of manufacture previously described. In particular, both the circuit 310 of FIG. 3 and the circuit 410 of FIG. 4 show a conductive layer 42 positioned on top of an insulating layer 44, with border stitches 17 as previously described. An interior region 48 of the conductive layer 42 has been cut and removed during the steps of cutting and removing to create a void. Interior stitches 50 located outward from the removed region 48 exemplify another embodiment of the act of border stitching. Thus, for the complementary elements in FIGS. 3 and 4, the act of border stitching includes providing outer border stitching 17 near but slightly inward from the exterior border 3 and providing inner border stitching 50 near but slightly outward of the interior border 53, so that a portion of the conductive layer within the interior border 53 (as shown in FIGS. 3 and 4) may be removed with the cutting device.

In some embodiments, active and/or passive electrical components may be attached to any one or more conductive regions of fabric on any layer(s). For instance, the circuit 410 shown in FIG. 4 illustrates a first black box 70 and a structurally-separated second black box 72, each box representative of an electrical device, with the boxes being connected together by the conductive layer 42.

FIG. 5 also illustrates a method of manufacturing a multi-layer circuit with electrical connectivity between varieties of different conductive layers. For this embodiment, the inner layers 42A, 44A, 42B are attached, and then the circuit traces corresponding to layers 42A and 42B are cut, with the unneeded portions of the conductive layers being removed. Next, additional layers 44B, 42C are attached, and then conductive layer 42C is cut according to its corresponding circuit trace. If desired, electrical connectivity may be established between conductive layers 42A and 42C. Other layers are then added, as required, with electrical connectivity, if desired, being established for each layer of conductive fabric as previously described above. In another embodiment, the two multi-layer constructs 62 and 64 are attached and, if desired, electrical connectivity may be established between the outer layers of the construct 62 (represented by layer 42D) and the outer layer 42E of construct 64 by electrical interconnect device 65. The attachment between any layer or between constructs is made by an attachment device.

FIG. 7 illustrates a system suitable for implementing a method of manufacturing a fabric circuit in accordance with some of the embodiments disclosed herein. As mentioned previously above, computer 30 is used to create the circuit trace 32, 32B utilizing CAD software similar to that used to form a printed circuit board (PCB) layout. The trace 32 (or 32B) is converted into a set of instructions and transmitted to an attachment device 34, which may be an embroidery machine, an adhesive hot gun machine, a laser, or a rivet machine 34. Once the conductive and non-conductive layers are attached, cutting device 36 is used to cut off the excess portion of the conductive layer that is not used for the construction of a circuit. Optionally, a vacuum table 33 may be used with the cutting device 36 to hold the layers of fabric in position. The phantom box of FIG. 7 represented by a dashed line indicates that the attachment device 34, the cutting device 36, and the vacuum table 33 may form one integrated unit. Operation of this system provides for the manufacture of a fabric construct 10, with the process being repeated (if desired) to form a multi-layered construct such as the construct 60 of FIG. 5. The system enables the manufacture of fabric circuits in an automated fashion to provide microwave transmission lines with good dimensional control, geometrically complex antennas, and general analog and digital circuits.

A particular feature of the fabric circuit manufactured by one of the methods described in the embodiments herein is the maintenance of tight dimensional control for the size and relative positioning of the conductive elements and traces. The conductive layer 42 may be a highly conductive pre-woven fabric, and the stitching between the conductive and non-conductive layers significantly reduces the likelihood of threads from the conductive layer separating from other threads of the conductive layer.

In one exemplary embodiment, the conductive fabric 42 may comprise a woven nylon base and may be plated with silver, copper, and nickel, such as the commercially available woven conductive fabric named Nora sold by Shieldex Trading of Palmyra, N.Y. Such conductive fabric may be substantially planar. The thickness of the conductive fabric 42 may be approximately 0.06 mm with a surface resistivity specification (as given by the manufacturer) of approximately 0.03 Ω/square. In another embodiment, a conventional polyester cloth may be selected as a non-conductive layer 44 for the construct. In yet another embodiment, a commercially available felt known as Nomex™ felt may be selected as a thick substrate of non-conductive fabric having low permittivity for applications such as a microstrip transmission line. Such non-conductive fabric may also be substantially planar.

The embodiments described herein have some other advantages worth noting. First, the method of manufacture described herein results in fabric circuits with good surface conductivity because the conductive surface is tightly woven.

During use, fabric-based circuits for high-speed digital and RF applications commonly require analysis of additional considerations, including Ohmic loss, impedance control, and unintentional radiation. High Ohmic loss may limit the resulting fabric circuit to applications involving low current flow, and hence, lower circuit speeds. Given the tight weave of the conductive fabric and the precision afforded by an automated attachment device and an automated cutting device, the method described herein should be well suited to achieving good impedance control with low Ohmic loss to enable use in a fast, high-speed circuit.

Second, the embroidery thread used herein may be nonconductive. Given that the variety of nonconductive threads for use in embroidery is much wider than that of conductive threads, greater choice in design exists when determining the most desirable embroidery thread, which is dependent upon the size and material strength of the thread.

Third, the methods disclosed herein enable techniques for creating circuits and antennas with complex geometrical shapes. For instance, while some constructs may require a simple design such as a rectangular strip, other applications, such as a directional coupler, require a more geometrically complex shape and design. Because the formation of the circuit trace utilizes a technique similar to the fabrication of a rigid printed circuit board (PCB), the methods disclosed herein translate well into automated manufacture of such complex geometric shapes.

The embodiments disclosed herein have numerous fields of application and utility. For instance, fabric-based circuits would enable an antenna or other electronics to be built into a ski jacket or other clothing. Fabric RF antennas and circuits placed in clothing and textile apparel would enable the wearer to integrate with a wireless network, mobile telecommunications, an RFID tagging or sensing systems, and a Global Positioning System (GPS). With respect to wearable flexible circuits, the methods described herein should offer at least two advantages: (1) a desirable minimum bend radius of the resulting construct, and (2) the capability to endure washing of the fabric. Other potential uses include a deployable fabric antenna and a fabric antenna for insertion on the surface skin of aircraft or in an unmanned air vehicle (UAV).

Although only a few exemplary embodiments have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method of manufacturing a fabric-based circuit, comprising the steps of:
    (a) creating a first circuit trace having a shape with a border;
    (b) creating an attachment layout having an outline of similar shape but of slightly different size as compared to the border of the first circuit trace so as to provide a spacing between the border of the pre-determined shape of the first circuit trace and the outline of the attachment layout;
    (c) converting the first circuit trace into a set of instructions that is readable by an automated cutting device;
    (d) converting the attachment layout into a set of instructions that is readable by an embroidery machine;
    (e) layering at least one layer of conductive fabric and at least one layer of non-conductive fabric adjacent to one another so as to form a layered construction;
    (f) embroidering with an embroidery machine an outer border stitching with a non-conductive thread so as to attach the at least one layer of conductive fabric and the at least one layer of non-conductive fabric together at a position corresponding to the outline of the attachment layout, the embroidery machine performing its operation in accordance with the set of instructions that correlate to the attachment layout, the non-conductive thread retaining the layers of conductive and non-conductive fabric in a substantially planar engagement;
    (g) cutting with the automated cutting device the at least one layer of conductive fabric in accordance with the set of instructions that correlate to the first circuit trace such that the layer of conductive fabric is cut along a cut border that corresponds to the border of the shape of the first circuit trace; and
    (h) separating and removing an unattached portion of the at least one layer of cut conductive fabric from a desired portion of the same layer of cut conductive fabric, the outer border stitching being at a location adjacent the border of the shape of the first circuit trace such that the location of said outer border stitching provides a spacing between said outer border stitching and the cut border of the layer of conductive fabric after the step of cutting is performed.

2. The method of claim 1, wherein he automated cutting device is a laser cutout machine.

3. The method of claim 1, wherein the automated cutting device is a printed circuit board milling machine.

4. The method of claim 1, wherein the attachment layout further comprises fiducials to orient a coordinate system of the automated cutting device to the at least one layer of conductive fabric before the step of cutting the at least one layer of conductive fabric is performed.

5. The method of claim 1, wherein the first circuit trace is created on a computer using computer-aided design software.

6. The method of claim 1, further comprising:
    embroidering the at least one layer of conductive fabric and the at least one layer of non-conductive fabric with cross-fill stitches using a non-conductive thread at one or more locations.

7. The method of claim 1, further comprising:
    positioning the layered construction of fabric on a vacuum table to hold the layered construction in place before the step of cutting the at least one layer of conductive fabric.

8. The method of claim 1 wherein the spacing between said outer border stitching and the border of the cut layer of conductive fabric has a value ranging from about 0.010 inches to about 0.050 inches.

9. The method of claim 1, further comprising the steps of:
    creating a second border for the shape of the first circuit trace;
    creating the attachment layout to have a second outline of similar shape but of slightly different size as compared to the second border of the first circuit trace so as to provide a second spacing between the second border for the shape of the first circuit trace and the second outline of the attachment layout; and embroidering with the embroidery machine an inner border stitching with a non-conductive thread at a location inward of the outer border stitching and at a position corresponding to the second outline of the attachment layout, the embroidery machine performing its operation in accordance with the set of instructions that correlate to the attachment layout.

10. The method of claim 9, further comprising the steps of:

cutting with the automated cutting device the at least one layer of conductive fabric in accordance with the set of instructions that correlate to the first circuit trace such that the at least one layer of conductive fabric is cut along a second cut border inward of the inner border stitching that corresponds to the second border of the shape of the first circuit trace; and separating and removing an undesired portion of the at least one cut layer of conductive fabric corresponding to the second cut border from a desired portion of the same layer of cut conductive fabric so as to form a layer of cut conductive fabric having a void interior to the location of the inner border stitching.

11. The method of claim 1, further comprising the steps of:

repeating steps (a)-(h) to manufacture a second fabric-based circuit; and embroidering with the embroidery machine the second fabric-based circuit with non-conductive thread to the fabric-based circuit manufactured by the first performance of steps (a)-(h).

12. The method of claim 11, further comprising:

connecting electrically at least one layer of cut conductive fabric of the second fabric-based circuit to the desired portion of at least one layer of cut conductive fabric of the fabric-based circuit manufactured by the first performance of steps (a)-(h).

13. The method of claim 12, wherein the step of connecting electrically is performed by one of the group consisting of conductive thread, a rivet, a metal pin, a conductive button, and wire.

* * * * *